United States Patent [19]

Ikeno et al.

[11] 4,370,584
[45] Jan. 25, 1983

[54] ELECTRODE CONFIGURATION FOR THICKNESS-SHEAR MODE PIEZOELECTRIC VIBRATOR

[75] Inventors: Hitoshi Ikeno; Tetsuro Konno; Mitsuyuki Sugita; Hirofumi Yanagi, all of Tokyo, Japan

[73] Assignee: Seikosha Co., Ltd., Japan

[21] Appl. No.: 128,952

[22] Filed: Mar. 10, 1980

[30] Foreign Application Priority Data

Mar. 12, 1979 [JP] Japan .................... 54-28417

[51] Int. Cl.³ ............................................ H01L 41/08
[52] U.S. Cl. .................................. 310/365; 310/312; 310/320; 310/369
[58] Field of Search ............... 310/312, 320, 365, 366, 310/369

[56] References Cited

U.S. PATENT DOCUMENTS

| | | | |
|---|---|---|---|
| 3,781,577 | 12/1973 | Nonaka | 310/365 |
| 4,066,986 | 1/1978 | Takano et al. | 310/366 X |
| 4,211,947 | 7/1980 | Ikeno et al. | 310/365 X |

FOREIGN PATENT DOCUMENTS

| | | |
|---|---|---|
| 46-38947 | 9/1962 | Japan . |
| 918652 | 2/1963 | United Kingdom . |
| 617806 | 7/1978 | U.S.S.R. .................... 310/365 |

*Primary Examiner*—Mark O. Budd
*Attorney, Agent, or Firm*—Robert E. Burns; Emmanuel J. Lobato; Bruce L. Adams

[57] ABSTRACT

A driving electrode on a surface of the piezoelectric vibrator in accordance with the present invention has a blank which is narrow at the center portion and wide at the right and left portions on the Z axis. And the driving electrode is the shape easy to operate in the fundamental main vibration, and hard to operate in the spurious vibration. Thus the piezoelectric vibrator operates efficiently in the fundamental main vibration.

17 Claims, 9 Drawing Figures

ELECTRODE CONFIGURATION FOR THICKNESS-SHEAR MODE PIEZOELECTRIC VIBRATOR

BACKGROUND OF THE INVENTION

The present invention relates to a piezoelectric vibrator, and more precisely, to a piezoelectric vibrator whose fundamental main vibration mode is the thickness-shear mode such as an AT-cut quartz vibrator, a BT-cut quartz vibrator or a ceramic vibrator.

Generally a quartz vibrator operates in the fundamental main vibration mode and in many spurious vibration modes. In the case that the frequency of the fundamental main vibration is adjacent to the frequency of the spurious vibration, there is a likelihood that the quartz vibrator operate in the spurious vibration mode or be adversely influenced by the spurious vibration.

SUMMARY OF THE INVENTION

It is the feature of the present invention that one of the driving electrodes on a surface of the piezoelectric piece has a blank region which is narrow at the center portion and wide at the right and left portions of the center portion on the Z axis.

It is an object of the present invention to provide a piezoelectric vibrator which is operated efficiently in the fundamental main vibration mode, and suppressed to operate in the spurious vibration modes.

It is another object of the present invention to improve the Q-value of a piezoelectric vibrator.

It is still another object of the present invention to provide a piezoelectric vibrator which is hard to be influenced by the stray capacitance.

BRIEF DESCRIPTION OF THE DRAWING

The features, objects and advantages of the present invention will be more fully understood from the following description when read in conjunction with the accompanying drawings in which.

DETAILED DESCRIPTION OF THE INVENTION

Figure 1:
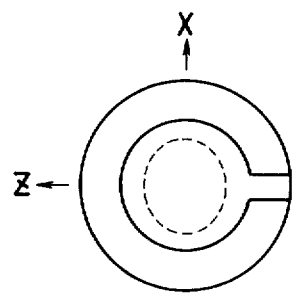
FIG. 1 is a front view of an AT-cut quartz vibrator showing a distribution of the electric charge operating in the fundamental main vibration mode by the dotted line.
Figure 3:
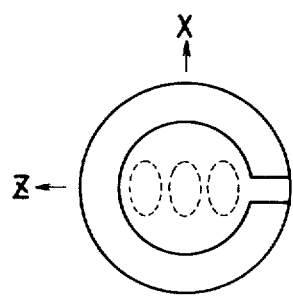
FIG. 3 is a front view of an AT-cut quartz vibrator showing a distribution of the electric charge operating in the spurious vibration mode by the dotted line.
Figure 2:
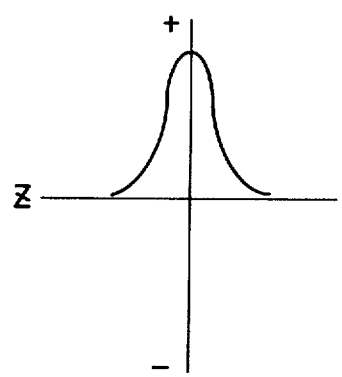
FIG. 2 is a distribution diagram of the electric charge on the Z axis in the fundamental main vibration of the vibrator shown in FIG. 1.
Figure 4:
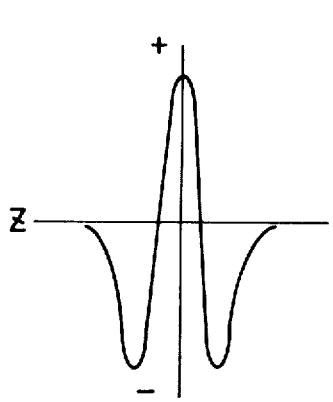
FIG. 4 is a distribution diagram of the electric charge on the Z axis in the spurious vibration of the vibrator shown in FIG. 3.

Generally, a quartz vibrator operates in the fundamental main vibration mode and in the many spurious vibration modes. In the case that the frequency of the fundamental main vibration is adjacent to the frequency of a spurious vibration, the quartz vibrator operates in the spurious vibration mode or is adversely influenced by the spurious vibration. For example an AT-cut thickness-shear mode quartz vibrator whose fundamental frequency is about 4.2 MHz operates in a spurious vibration mode whose frequency is about 4.6 MHz. This fundamental main vibration mode (I) has a distribution of electric charge as shown in FIG. 1, and a diagram of the distribution of the electric charge on the Z axis is shown in FIG. 2, measuring by prove method. This spurious vibration mode (II) has a distribution of electric charge as shown in FIG. 3, and shows the diagram of the distribution of the electric charge on the Z axis is shown in FIG. 4, similarly measuring by prove method. Referring to FIGS. 1 and 2, in the fundamental main vibration mode (I), a plus electric charge concentrates at the center portion of the quartz piece. And referring to FIGS. 3 and 4, in the spurious vibration mode (II), a plus component of the electric charge concentrates at the center portion of the quartz piece, and two minus components of the electric charge concentrate at the right and left portions of the plus component on the Z axis. This distribution of the electric charge is substantially equal to the distribution of the vibration energy. The present invention provides a piezoelectric vibrator whose shape of the driving electrodes is easy to operate in the fundamental main vibration mode and hard to operate in the spurious vibration modes.

Figure 6:
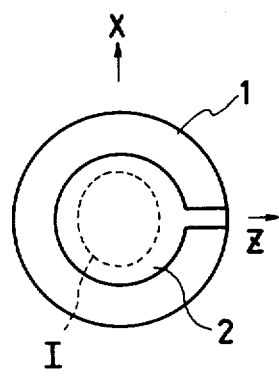
FIG. 6 is a front view of an AT-cut quartz vibrator according to an embodiment of the present invention showing a distribution of the electric charge operating in the fundamental main vibration mode (I)
Figure 7:
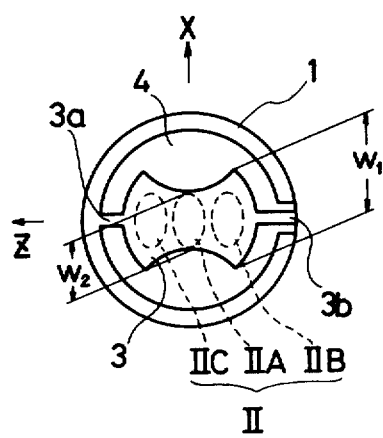
FIG. 7 is a rear view of the vibrator shown in FIG. 6 showing a distribution of the electric charge operating in the spurious vibration mode (II)

Two embodiments of the present invention are described below with reference to the drawings. Referring to FIGS. 6 and 7, a thickness-shear mode quartz vibrator according to the present invention comprises a quartz piece 1, front driving electrode 2 and rear driving electrode 4 the center portion of which is blank 3, i.e., free of any electrode. The front driving electrode 2, which usually has a circular shape, is formed on a surface of the quartz piece 1 by evaporation or other conventional method as shown in FIG. 6. The rear driving electrode 4 whose center portion is provided with the blank region 3 is formed on the other surface of the quartz piece 1 by evaporation or other conventional method as shown in FIG. 7. The blank space 3 has a special shape. That is to say, the portions of the blank 3 which correspond with the right component (IIB) and left component (IIC) of the electric charge of the spurious vibration mode (II) are made wide ($W_1$) in the direction of the X axis, and the portion of the blank 3 which corresponds with the electric charge of the fundamental main vibration mode (I), that is the center portion of the quartz vibrator, is made narrow ($W_2$) in the direction of the X axis as shown in FIG. 7. In other words, the shape of the blank region 3 is narrow at the electrode center portion and wide at the right and left portions of the center portion in the direction of the Z axis. The shape of the blank region 3 is defined by a pair of spaced-apart and oppositely facing concave portions separated by a pair of spaced-apart and oppositely facing convex portions of the driving electrode 4 as shown in FIG. 7. In the embodiment shown, the driving electrode 4 is formed of two electrode pieces separated by the blank region 3 and slits 3a and 3b. The slits 3a and 3b connected with the blank 3 correspond to the supports of the mask used to make the blank 3 during formation of the rear electrode 4 by evaporation. If the blank 3 is made on the rear electrode 4 by another suitable method, the slits 3a and 3b would not be necessary.

As stated above, the blank 3 is defined by the rear driving electrode 4, the center portion of the blank 3 is relatively narrow ($W_2$) so that the center portion of the rear electrode 4 projects into the blank region of the center portion of 3, and the right and left portions of the blank 3, which correspond with the right and left components of the electric charge of the spurious vibration mode, are relatively wide ($W_1$) so that the electrode is taken off over a wide area, whereby the quartz vibrator according to this invention operates efficiently in the fundamental main vibration mode, and is hard to operate in the spurious vibration mode.

Figure 5:
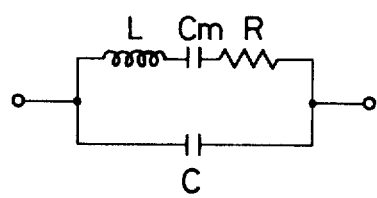
FIG. 5 is a equivalent circuit diagram of a quartz vibrator.

The quartz vibrator according to the present invention can increase the Q-value, as a motional capacitance Cm decreases markedly, but a crystal resistance R increases only slightly as shown in FIG. 5. The quartz vibrator hardly has influence on the stray capacitance by the decrement of the motional capacitance Cm, and can improve the stability of the vibration frequency. Furthermore, as one of the driving electrodes, that is the rear driving electrode, does not have an electrode film at the center portion of the quartz piece wherein the vibration displacement is large, the change of the frequency of the quartz vibrator by aging is small. And the trimming of the frequency by use of an additional mass can adjust the frequency efficiently, since the other driving electrode, that is the front driving electrode, has a electrode film at the center portion of the quartz piece wherein the vibration displacement is large.

In this embodiment, it is necessary that the front driving electrode 2 has the electrode film at least at the portion wherein the electric charge of the fundamental main vibration concentrates as shown by the dotted line in FIG. 6. But it is desirable the front driving electrode be the large circular electrode shown in FIG. 6 to impart good values of crystal resistance R and motional capacitance Cm.

Another embodiment of the present invention will now be described with reference to FIGS. 8 and 9.

A front driving electrode 12 which is long in the direction of the X axis is formed on a surface of a quartz piece 11 by evaporation or other conventional method. The front driving electrode 12 may have not only the shape shown in FIG. 8 which has projections 12a and 12b extending from a circular electrode in the direction of the X axis shown in FIG. 8 but also may have an oblong shape such as an ellipse which is long in the direction of the X axis. A rear driving electrode 14 whose center portion is provided with a blank 13 is formed on the other surface of the quartz piece 11, that is the electrode 14 has the same shape as the electrode 4 shown in FIG. 7.

Figure 8:
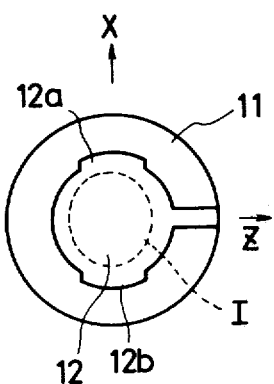
FIG. 8 is a front view of an AT-cut quartz vibrator according to another embodiment of the present invention.
Figure 9:
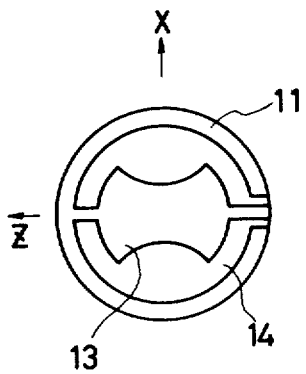
FIG. 9 is a rear view of the vibrator shown in FIG. 8.

When a voltage is applyed to the front driving electrode 12 and the rear driving electrode 14, the quartz vibrator shown in FIGS. 8 and 9 operates efficiently in the fundamental main vibration mode, and is hard to operate in the spurious vibration mode in the same manner as in the aforementioned embodiment shown in FIGS. 6 and 7. Furthermore, the motional capacitance Cm and the crystal resistance R shown in the equivalent diagram of FIG. 5 have better values by using the front electrode 12 which has projections in the direction of the X axis. That is to say, the crystal resistance R descreases markedly, but the motional capacitance Cm increases slightly. This is because the rear driving electrode 14 is long in the direction of the X axis, and the overlapping of the front driving electrode 12 and the rear driving electrode 14 is large.

According to the present invention as mentioned in detail, a piezoelectric vibrator is operated efficiently in the fundamental main vibration mode and suppressed to operate in the spurious vibration mode. Furthermore, the change of the frequency of the piezoelectric vibrator by aging is small. Besides, the trimming of the frequency by using an additional mass can adjust the vibration frequency efficiently.

What we claim is:

1. A thickness-shear mode piezoelectric vibrator comprising: a thickness-shear mode piezoelectric piece having opposite major surfaces and vibratable in a fundamental main vibration mode and spurious vibration modes; and driving electrodes disposed on said opposite major surfaces of said piezoelectric piece for driving said piezoelectric piece in the fundamental main vibration mode, one of said driving electrodes being disposed on one of said major surfaces and overlying the center portion thereof at a location where electric charge concentrates during the fundamental main vibration, and the other of said driving electrodes being disposed on the other of said major surfaces and overlying portions thereof at a location other than where electric charge concentrates during at least one spurious mode vibration, said other driving electrode being configured to define an electrode-free region where said other major surface is free of and not covered by said other driving electrode, said electrode-free region having a center region located where electric charge concentrates during the fundamental main vibration and two side regions one on either side of the center region in the direction of the Z axis of the piezoelectric piece at locations where components of electric charge concentrate during said one spurious vibration, the two side regions being wider than the center region in the direction of the X axis of the piezoelectric piece.

2. A thickness-shear mode piezoelectric vibrator according to claim 1; wherein said other driving electrode overlies the approximate marginal peripheral portion of said other major surface but not the center portion thereof.

3. A thickness-shear mode piezoelectric vibrator according to any one of claims 1 and 2; wherein said other driving electrode comprises a plurality of electrode pieces.

4. A thickness-shear mode piezoelectric vibrator according to any one of claims 1, 2, and 3; wherein said one driving electrode has a generally circular shape.

5. A thickness-shear mode piezoelectric vibrator according to any one of claims 1, 2 and 3; wherein said one driving electrode has a generally oblong shape.

6. A thickness-shear mode piezoelectric vibrator according to claim 5; wherein the oblong-shaped driving electrode has a circular portion, and two projecting portions projecting in the direction of the X axis from diametrically opposite sides of the circular portion.

7. A thickness-shear mode piezoelectric vibrator according to claim 1; wherein said electrode-free region is defined by a pair of spaced-apart and oppositely facing concave portions separated by a pair of spaced-apart and oppositely facing convex portions of said other driving electrode.

8. A thickness-shear mode piezoelectric vibrator according to claim 7; wherein said other driving electrode comprises a pair of symmetrical electrode pieces each including one of said pair of concave portions and half of said pair of convex portions.

9. A thickness-shear mode piezoelectric vibrator according to claim 7; wherein said one driving electrode has a generally circular shape.

10. A thickness-shear mode piezoelectric vibrator according to claim 7; wherein said one driving electrode has a generally oblong shape.

11. A thickness-shear mode piezoelectric vibrator according to claim 10; wherein the oblong-shaped driving electrode has a circular portion, and two projecting portions projecting in the direction of the X axis from diametrically opposite sides of the circular portion.

12. A thickness-shear mode piezoelectric vibrator comprising: a thickness-shear mode piezoelectric piece having opposite major surfaces and vibratable in a fundamental main vibration mode and spurious vibration modes; and driving electrodes disposed on said opposite major surfaces of said piezoelectric piece, one of said driving electrodes being disposed on one of said major surfaces at a location overlying the center portion of said one major surface of said piezoelectric piece where electric charge concentrates during the fundamental main vibration, and the other of said driving electrodes being disposed on the other of said major surfaces and having a center electrode portion provided with an electrode-free blank region where said other major surface is not covered by said other driving electrode, said electrode-free blank region having a center portion where electric charge concentrates during the fundamental main vibration and which is relatively narrow in the direction of the X axis, and side portions disposed on opposite sides of said center portion in the direction of the Z axis where components of electric charge concentrate during a spurious vibration mode and which are relatively wide in the direction of the X axis.

13. A thickness-shear mode piezoelectric vibrator according to claim 12; wherein said other driving electrode overlies the approximate marginal peripheral portion of said other major surface.

14. A thickness-shear mode piezoelectric vibrator according to any one of claims 12 and 13, wherein said other driving electrode comprises a plurality of electrode pieces.

15. A thickness-shear mode piezoelectric vibrator according to any one of claims 12, 13 and 14, wherein said one driving electrode has a generally circular shape.

16. A thickness-shear mode piezoelectric vibrator according to any one claims 12, 13 and 14, wherein said one driving electrode has a generally oblong shape.

17. A thickness-shear mode piezoelectric vibrator according to claim 16, wherein the oblong-shaped driving electrode has a circular portion, and two projecting portions projecting in the direction of the X axis from diametrically opposite sides of the circular portion.

* * * * *